(12) United States Patent
Osaka

(10) Patent No.: US 10,698,319 B2
(45) Date of Patent: Jun. 30, 2020

(54) EXPOSURE APPARATUS, EXPOSURE METHOD, AND ARTICLE MANUFACTURING METHOD

(71) Applicant: CANON KABUSHIKI KAISHA, Tokyo (JP)

(72) Inventor: Noboru Osaka, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 16/352,939

(22) Filed: Mar. 14, 2019

(65) Prior Publication Data
US 2019/0285988 A1 Sep. 19, 2019

(30) Foreign Application Priority Data
Mar. 19, 2018 (JP) .................. 2018-051519

(51) Int. Cl.
*G03B 27/42* (2006.01)
*G03F 7/20* (2006.01)
(52) U.S. Cl.
CPC .................. *G03F 7/702* (2013.01)
(58) Field of Classification Search
CPC .......... G03F 7/0002; G03F 7/20; G03F 1/144; G03F 7/70075; G03F 7/70141; G03F 7/70725; H01L 21/0274; H04N 5/2353; H04N 5/2351; H04N 5/2256; H04N 5/23216; H04N 5/23241; H04N 9/643
See application file for complete search history.

(56) References Cited

U.S. PATENT DOCUMENTS

| | | | |
|---|---|---|---|
| 6,886,154 B2 | 4/2005 | Okuyama | |
| 2008/0316458 A1* | 12/2008 | Sumi | B41J 2/465 355/69 |

FOREIGN PATENT DOCUMENTS

| | | |
|---|---|---|
| JP | 2003050469 A | 2/2003 |
| JP | 2006085070 A | 3/2006 |

* cited by examiner

*Primary Examiner* — Mesfin T Asfaw
(74) *Attorney, Agent, or Firm* — Rossi, Kimms & McDowell LLP

(57) ABSTRACT

An exposure apparatus that performs scanning exposure for a substrate is provided. The apparatus comprises a light source, a digital mirror device including a plurality of mirrors capable of controlling a direction of light emitted from the light source and configured to operate to adjust an integrated exposure amount on the substrate in accordance with scanning of the substrate, a projection optical system configured to guide light from the digital mirror device to the substrate and project a pattern onto the substrate, and a controller configured to control the plurality of mirrors in the digital mirror device based on the pattern to be projected onto the substrate, wherein the controller controls the plurality of mirrors such that an integrated exposure amount in an edge portion of the pattern becomes larger than an integrated exposure amount in a portion other than the edge portion.

11 Claims, 10 Drawing Sheets

FIG. 8A

| | j=1 | j=2 | j=3 | j=4 | j=5 | j=6 | j=7 | j=8 | j=9 | j=10 | j=11 | TOTAL |
|---|---|---|---|---|---|---|---|---|---|---|---|---|
| i=1 | 102 | 98 | 101 | 100 | 97 | 102 | 101 | 100 | 98 | 99 | 101 | 1099 |
| i=2 | 98 | 99 | 100 | 102 | 100 | 101 | 99 | 100 | 100 | 98 | 102 | 1099 |
| i=3 | 101 | 100 | 99 | 100 | 101 | 99 | 98 | 98 | 102 | 99 | 103 | 1100 |
| i=4 | 101 | 99 | 100 | 102 | 101 | 100 | 102 | 99 | 101 | 98 | 99 | 1101 |
| i=5 | 100 | 102 | 100 | 99 | 97 | 100 | 99 | 98 | 102 | 98 | 100 | 1095 |
| i=6 | 98 | 99 | 100 | 99 | 103 | 101 | 99 | 103 | 99 | 99 | 98 | 1098 |

FIG. 8B

| | j=1 | j=2 | j=3 | j=4 | j=5 | j=6 | j=7 | j=8 | j=9 | j=10 | j=11 |
|---|---|---|---|---|---|---|---|---|---|---|---|
| i=1 | 0 | 0 | 0 | 0 | 0 | 0 | 0 | 0 | 0 | 0 | 0 |
| i=2 | 1 | 1 | 1 | 1 | 1 | 0 | 1 | 0 | 1 | 1 | 1 |
| i=3 | 1 | 1 | 1 | 1 | 1 | 1 | 1 | 1 | 1 | 0 | 0 |
| i=4 | 1 | 1 | 1 | 1 | 1 | 1 | 0 | 1 | 0 | 1 | 1 |
| i=5 | 1 | 1 | 1 | 1 | 0 | 1 | 1 | 1 | 1 | 1 | 0 |
| i=6 | 0 | 0 | 0 | 0 | 0 | 0 | 0 | 0 | 0 | 0 | 0 |

FIG. 8C

| | j=1 | j=2 | j=3 | j=4 | j=5 | j=6 | j=7 | j=8 | j=9 | j=10 | j=11 | TOTAL |
|---|---|---|---|---|---|---|---|---|---|---|---|---|
| i=1 | 0 | 0 | 0 | 0 | 0 | 0 | 0 | 0 | 0 | 0 | 0 | 0 |
| i=2 | 98 | 99 | 100 | 102 | 100 | 0 | 99 | 0 | 100 | 98 | 102 | 898 |
| i=3 | 101 | 100 | 99 | 100 | 101 | 99 | 98 | 98 | 102 | 0 | 0 | 898 |
| i=4 | 101 | 99 | 100 | 102 | 101 | 100 | 0 | 99 | 0 | 98 | 99 | 898 |
| i=5 | 100 | 102 | 100 | 99 | 0 | 100 | 99 | 98 | 102 | 98 | 100 | 898 |
| i=6 | 0 | 0 | 0 | 0 | 0 | 0 | 0 | 0 | 0 | 0 | 0 | 0 |

FIG. 9A

| | j=1 | j=2 | j=3 | j=4 | j=5 | j=6 | j=7 | j=8 | j=9 | j=10 | j=11 | TOTAL |
|---|---|---|---|---|---|---|---|---|---|---|---|---|
| i=1 | 102 | 98 | 101 | 100 | 97 | 102 | 101 | 100 | 98 | 99 | 101 | 1099 |
| i=2 | 98 | 99 | 100 | 102 | 100 | 101 | 99 | 100 | 100 | 98 | 102 | 1099 |
| i=3 | 101 | 100 | 99 | 100 | 101 | 99 | 98 | 98 | 102 | 99 | 103 | 1100 |
| i=4 | 101 | 99 | 100 | 102 | 101 | 99 | 102 | 99 | 101 | 98 | 99 | 1101 |
| i=5 | 100 | 102 | 100 | 99 | 97 | 100 | 99 | 98 | 102 | 98 | 100 | 1095 |
| i=6 | 98 | 99 | 100 | 99 | 103 | 101 | 99 | 103 | 99 | 99 | 98 | 1098 |

FIG. 9B

| | j=1 | j=2 | j=3 | j=4 | j=5 | j=6 | j=7 | j=8 | j=9 | j=10 | j=11 |
|---|---|---|---|---|---|---|---|---|---|---|---|
| i=1 | 0 | 0 | 0 | 0 | 0 | 0 | 0 | 0 | 0 | 0 | 0 |
| i=2 | 1 | 1 | 1 | 1 | 1 | 0 | 1 | 1 | 1 | 1 | 1 |
| i=3 | 1 | 1 | 1 | 1 | 1 | 1 | 1 | 1 | 1 | 0 | 0 |
| i=4 | 1 | 1 | 1 | 1 | 1 | 1 | 0 | 1 | 0 | 1 | 1 |
| i=5 | 1 | 1 | 1 | 1 | 0 | 1 | 1 | 1 | 1 | 1 | 1 |
| i=6 | 0 | 0 | 0 | 0 | 0 | 0 | 0 | 0 | 0 | 0 | 0 |

FIG. 9C

| | j=1 | j=2 | j=3 | j=4 | j=5 | j=6 | j=7 | j=8 | j=9 | j=10 | j=11 | TOTAL |
|---|---|---|---|---|---|---|---|---|---|---|---|---|
| i=1 | 0 | 0 | 0 | 0 | 0 | 0 | 0 | 0 | 0 | 0 | 0 | 0 |
| i=2 | 98 | 99 | 100 | 102 | 100 | 0 | 99 | 100 | 100 | 98 | 102 | 998 |
| i=3 | 101 | 100 | 99 | 100 | 101 | 99 | 98 | 98 | 102 | 0 | 0 | 898 |
| i=4 | 101 | 99 | 100 | 102 | 101 | 99 | 0 | 99 | 0 | 98 | 99 | 898 |
| i=5 | 100 | 102 | 100 | 99 | 0 | 100 | 99 | 98 | 102 | 98 | 100 | 998 |
| i=6 | 0 | 0 | 0 | 0 | 0 | 0 | 0 | 0 | 0 | 0 | 0 | 0 |

EXPOSURE APPARATUS, EXPOSURE METHOD, AND ARTICLE MANUFACTURING METHOD

BACKGROUND OF THE INVENTION

Field of the Invention

The present invention relates to an exposure apparatus, an exposure method, and an article manufacturing method.

Description of the Related Art

In recent years, as the HD (High Definition) standardization of a television system advances, thin-type FPDs (Flat Panel Displays) are often used as display devices. Along with this, demands for larger screens and a higher resolution as well as for lower costs have become stronger. In the manufacture of the FPD, a photolithography technique similar to that used in the integrated circuit industry is used to project a circuit pattern on an original (mask) onto a glass substrate coated with a photosensitive resist, thereby transferring and forming the pattern on the substrate. In a conventional method of projecting and exposing a mask, an increase in size of a display screen leads to an increase in size of a mask itself. Along with this, the manufacturing cost increases due to enlargement of the material and ensuring uniformity of the line width over the entire surface and the manufacturing period of the mask is also prolonged, which can seriously hinder the mass production process.

As an exposure method to compensate for such defects, there is maskless exposure in which a pattern is directly drawn by using a spatial light modulation device such as a DMD (Digital Micro-mirror Device). Since it is unnecessary to manufacture a mask, costs can be reduced.

In a maskless exposure apparatus, a method of setting the scanning direction obliquely with respect to a substrate is known as a method of forming a high-resolution pattern. In this case, since the spot position of the micro-mirror group in the same column is gradually shifted in the sub-scanning direction, overlapping exposure is possible (Japanese Patent Laid-Open No. 2003-050469). In addition, there is known a technique of, in order to attain a high resolution, combining spots two-dimensionally formed on a substrate surface by micro mirrors to form a desired pattern (Japanese Patent Laid-Open No. 2006-085070).

For example, in an FPD substrate, an IC, and the like, a plurality of exposure processes are performed on the same substrate so that the patterns formed in the respective exposure processes are superimposed. At this time, if the profile of the pattern formed in each exposure process or the accuracy of pattern formation is poor, superimposing is not successful, resulting in manufacturing failure.

SUMMARY OF THE INVENTION

The present invention provides, for example, an exposure apparatus advantageous in accuracy in pattern formation.

The present invention in its one aspect provides an exposure apparatus that performs scanning exposure for a substrate, comprising a light source, a digital mirror device including a plurality of mirrors capable of controlling a direction of light emitted from the light source and configured to operate to adjust an integrated exposure amount on the substrate in accordance with scanning of the substrate, a projection optical system configured to guide light from the digital mirror device to the substrate and project a pattern onto the substrate, and a controller configured to control the plurality of mirrors in the digital mirror device based on the pattern to be projected onto the substrate, wherein the controller controls the plurality of mirrors such that an integrated exposure amount in an edge portion of the pattern becomes larger than an integrated exposure amount in a portion other than the edge portion.

Further features of the present invention will become apparent from the following description of exemplary embodiments (with reference to the attached drawings).

BRIEF DESCRIPTION OF THE DRAWINGS

FIGS. 8A to 8C are tables for explaining a pattern edge emphasizing method in a case in which an illumination light distribution is not uniform;

FIGS. 9A to 9C are tables for explaining a pattern edge emphasizing method in a case in which the illumination light distribution is not uniform;

DESCRIPTION OF THE EMBODIMENTS

Various exemplary embodiments, features, and aspects of the invention will be described in detail below with reference to the drawings.

Embodiments of the present invention will be described in detail below with reference to the accompanying drawings. Note that the following embodiments are merely specific examples of the embodiments of the present invention, and do not limit the present invention. In addition, not all combinations of characteristic features described in the following embodiments are essential to the solution of the problem in the present invention.

(Maskless Exposure Apparatus)

Figure 1:
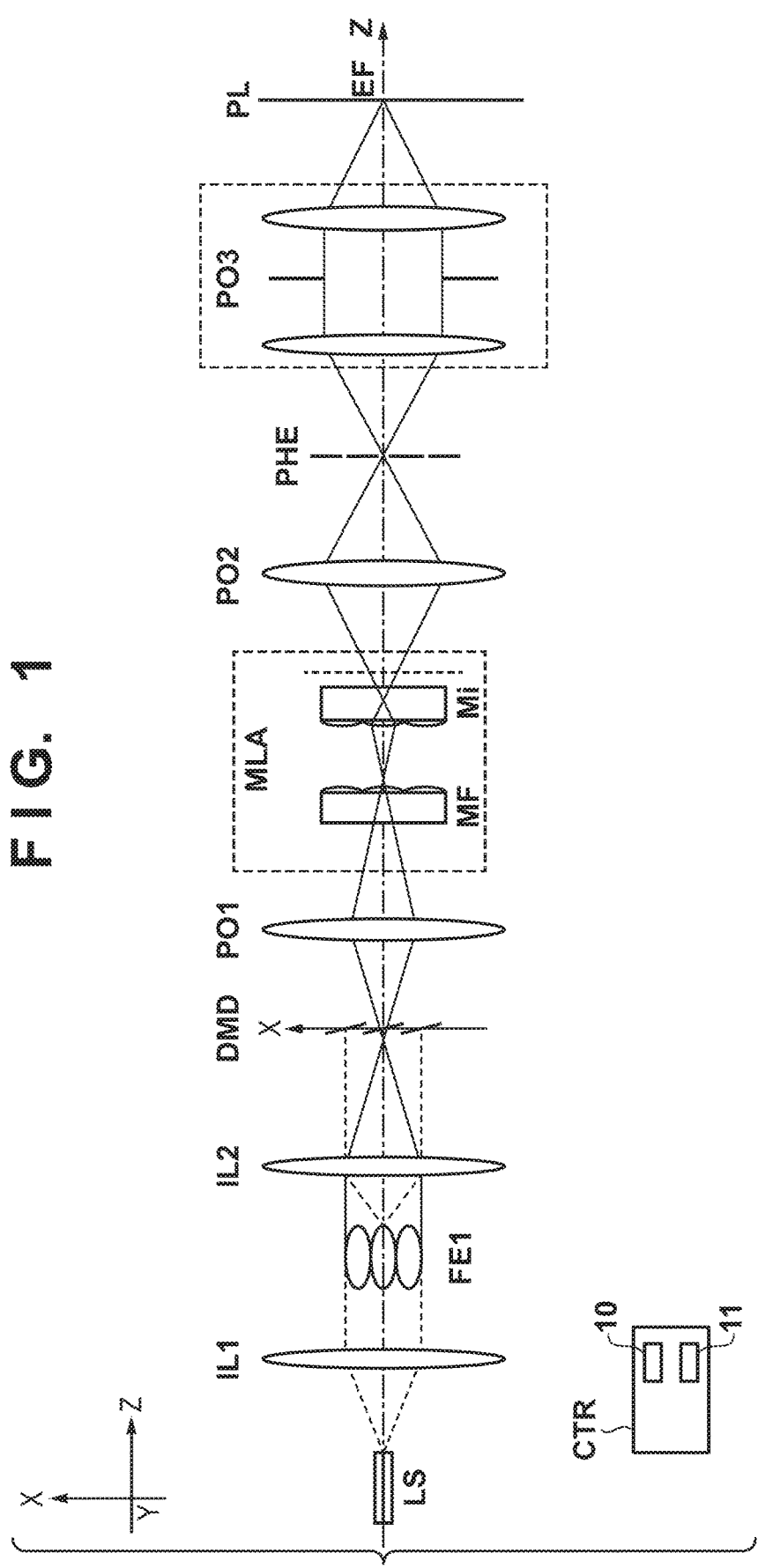
FIG. 1 is a view showing the arrangement of a maskless exposure apparatus according to an embodiment.

A maskless exposure apparatus in this embodiment is an exposure apparatus which performs scanning exposure for a substrate, and includes a DMD (Digital Micro-mirror Device) including a plurality of mirrors (micro mirrors) capable of controlling the direction of light emitted from a light source. The DMD can operate to adjust the integrated exposure amount at each position on a substrate in accordance with scanning of the substrate. The maskless exposure apparatus further includes a projection optical system which guides light from the DMD to project a pattern onto a substrate, and a controller which controls the plurality of mirrors in the DMD based on a pattern to be projected onto a substrate. With reference to FIG. 1, the arrangement of the maskless exposure apparatus in this embodiment will be described below.

A controller CTR controls respective units to be described later and comprehensively controls an exposure process. The controller CTR can be formed by, for example, a computer including a CPU 10 and a memory 11 (storage unit).

As a light source LS, for example, a semiconductor laser or an LED is used. The wavelength of the light source LS is selectable depending on the sensitivity of a photosensitive resist applied onto an exposure substrate and, for example, a wavelength from 300 nm to about 440 nm can be used.

An exposure light beam emitted from the light source LS is collimated by the function of an optical system IL1 and illuminates a fly-eye lens FE1. The exit surface of the fly-eye lens FE1 is disposed on the front-side focal plane of an optical system IL2, and a DMD plane is placed on the back-side focal plane of the optical system IL2. With this arrangement relation, a so-called Kohler illumination system is formed, in which a light beam emitted from the fly-eye lens EF1 is collimated by the optical system IL2 and illuminates the DMD plane with a uniform illuminance distribution.

Figure 2:
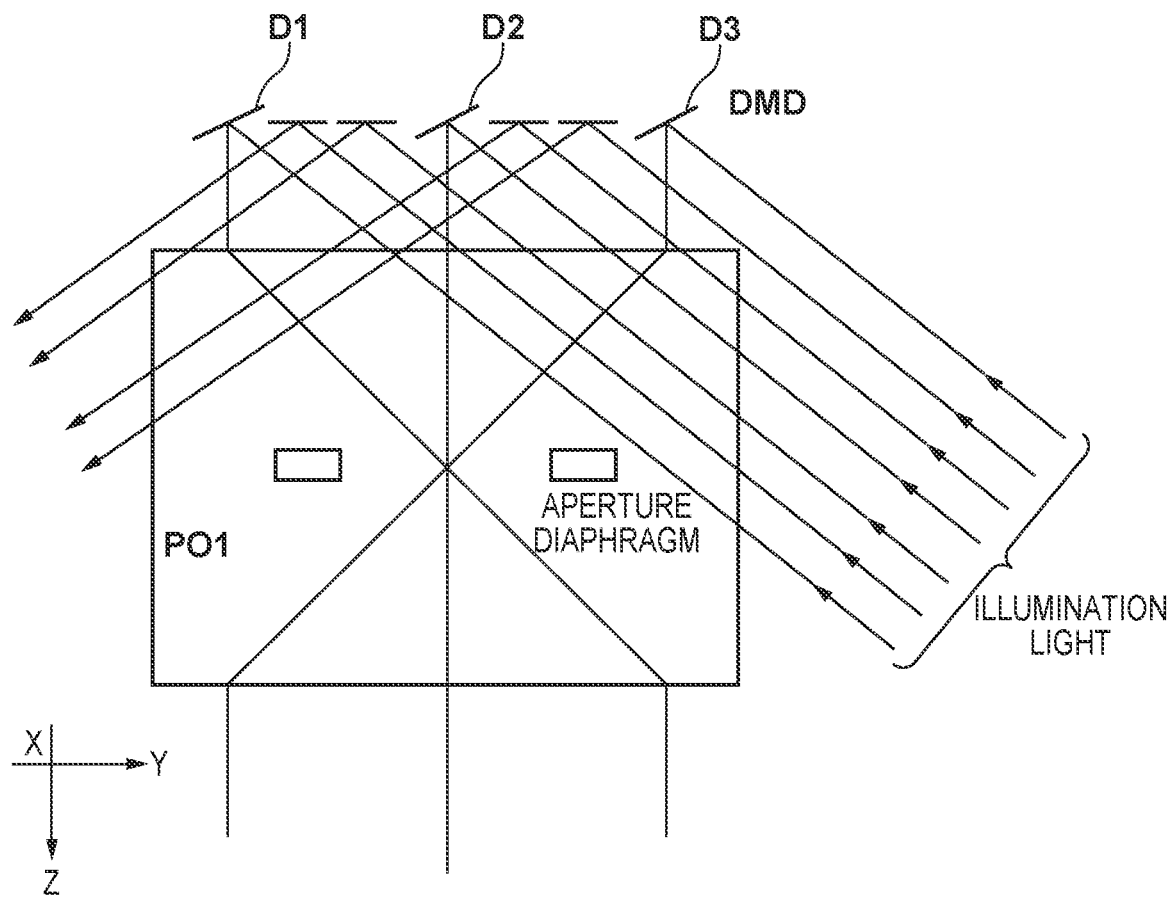
FIG. 2 is a view for explaining the function of a DMD.

FIG. 1 shows as if an illumination light beam enters and is transmitted through the DMD, but this is for facilitating the explanation of the imaging relation of an exposure light beam, and in practice, a light beam is reflected by the DMD as shown in FIG. 2. In FIG. 2, illumination light components entering mirrors D1, D2, and D3 set in an ON state among the plurality of mirrors of the DMD are guided to a downstream projection optical system PO1, and illumination light components entering the mirrors set in an OFF state do not enter the projection optical system PO1. In general, illumination light enters the DMD obliquely as shown in FIG. 2, but it may enter the DMD vertically using a beam splitter.

The projection optical system PO1 has a function of condensing a light beam reflected by the DMD onto a microlens array MLA. The microlens array MLA is formed from a front stage field lens MF and an imaging lens Mi disposed at a position separated by its focal length. A plurality of combinations, each of which includes the field lens MF and the imaging lens Mi facing each other, are two-dimensionally arrayed. A light beam imaged on the field lens MF by the function of the projection optical system PO1 is reimaged behind the imaging lens Mi by the function of the imaging lens Mi. The position of the imaging point in this case is often formed within 100 μm immediately after the imaging lens Mi because the imaging lens Mi is fine and its focal length is short and because it performs reduction imaging.

On the other hand, the field lens MF and the imaging lens Mi are respectively processed integrally, and a certain thickness is required for ensuring the stability during processing. Its thickness should be at least 300 μm or more. Therefore, the above-described reimaging point is formed inside the glass material of the imaging lens Mi. In this embodiment, this reimaging point is reimaged in the air by the function of a projection optical system PO2, and a pinhole plate PHE is disposed on the reimaging plane.

Figure 3:
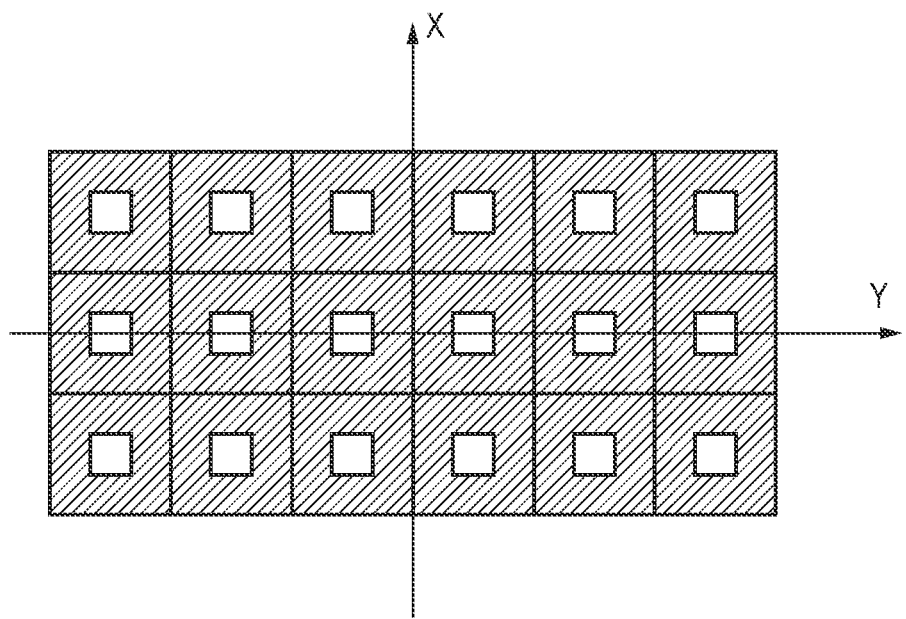
FIG. 3 is a view showing an example of the cross-sectional shape of a pinhole plate taken perpendicular to the optical axis.

FIG. 3 shows an example of the cross-sectional shape of the pinhole plate PHE taken perpendicular to the optical axis (Z-axis). In this embodiment, the microlens array MLA includes 3 rows×6 columns so that there are 18 pinholes in the pinhole plate PHE. Each pinhole corresponds to the position of each mirror of the DMD. The function of the pinhole is to block unnecessary flare light or to cut out the light spot formed by the microlens array MLA so as to further miniaturize the light spot on the substrate. The light beam transmitted through the pinhole plate PHE is imaged at a position EF on a substrate surface PL by the function of a projection optical system PO3.

(Pattern Formation Method)

Figure 4:
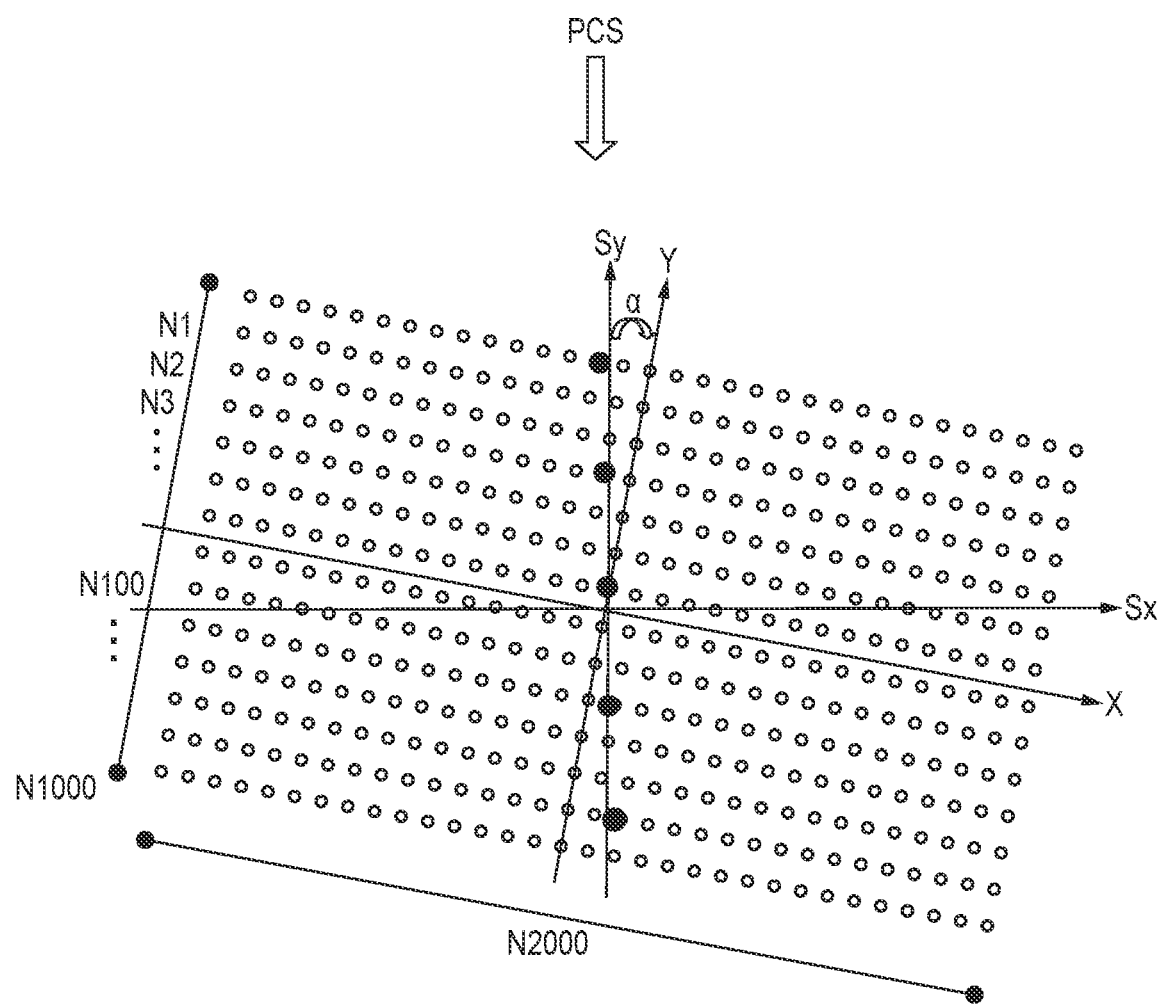
FIG. 4 shows the distribution of a light spot group formed by the DMD.

As described above, an exposure light beam is condensed at the position EF on the substrate surface PL to be exposed and a light spot group is formed. FIG. 4 shows the distribution of the light spot group, which is formed by the DMD, at the position EF on the substrate surface PL. In this embodiment, the plurality of mirrors of the DMD are arrayed in a two-dimensional grid pattern in 2,000 rows in the row direction (X direction) and 1,000 columns in the column direction (Y direction). Here, the row direction and column direction described above are oblique with respect to the scanning direction of a substrate. In the example shown in FIG. 4, a substrate scanning direction Sy is a direction rotated by a degrees with respect to the Y-axis direction. In FIG. 4, a direction Sx is a non-scanning direction orthogonal to the direction Sy and rotated by a degrees with respect to the X-axis direction. With this arrangement, for example, a pattern located at Sx=0 is intermittently exposed with light spots represented by black points on the Sy-axis during substrate scanning and the light energy is integrated, thereby obtaining a predetermined exposure amount. More specifically, the pattern undergoes integration exposure of 1,000× tan α. In FIG. 4, tan α=¼. Since a substrate enters the DMD exposure region from a direction indicated by PCS, it is first exposed from a row N1 (or a row N2 or N3, depending on the X position). Since the pinholes of the pinhole plate PHE are in one-to-one correspondence with the mirrors of the DMD, it is necessary to tilt the microlens array MLA and the pinhole plate PHE as much as the tilt angle of the DMD.

As described above, each pattern arranged in the non-scanning direction Sx is formed by superimposing spots formed by the plurality of mirrors of the DMD arranged in the scanning direction. In addition, the shape of an exposure pattern can be formed by combining the patterns adjacent in the non-scanning direction Sx.

Figure 5:
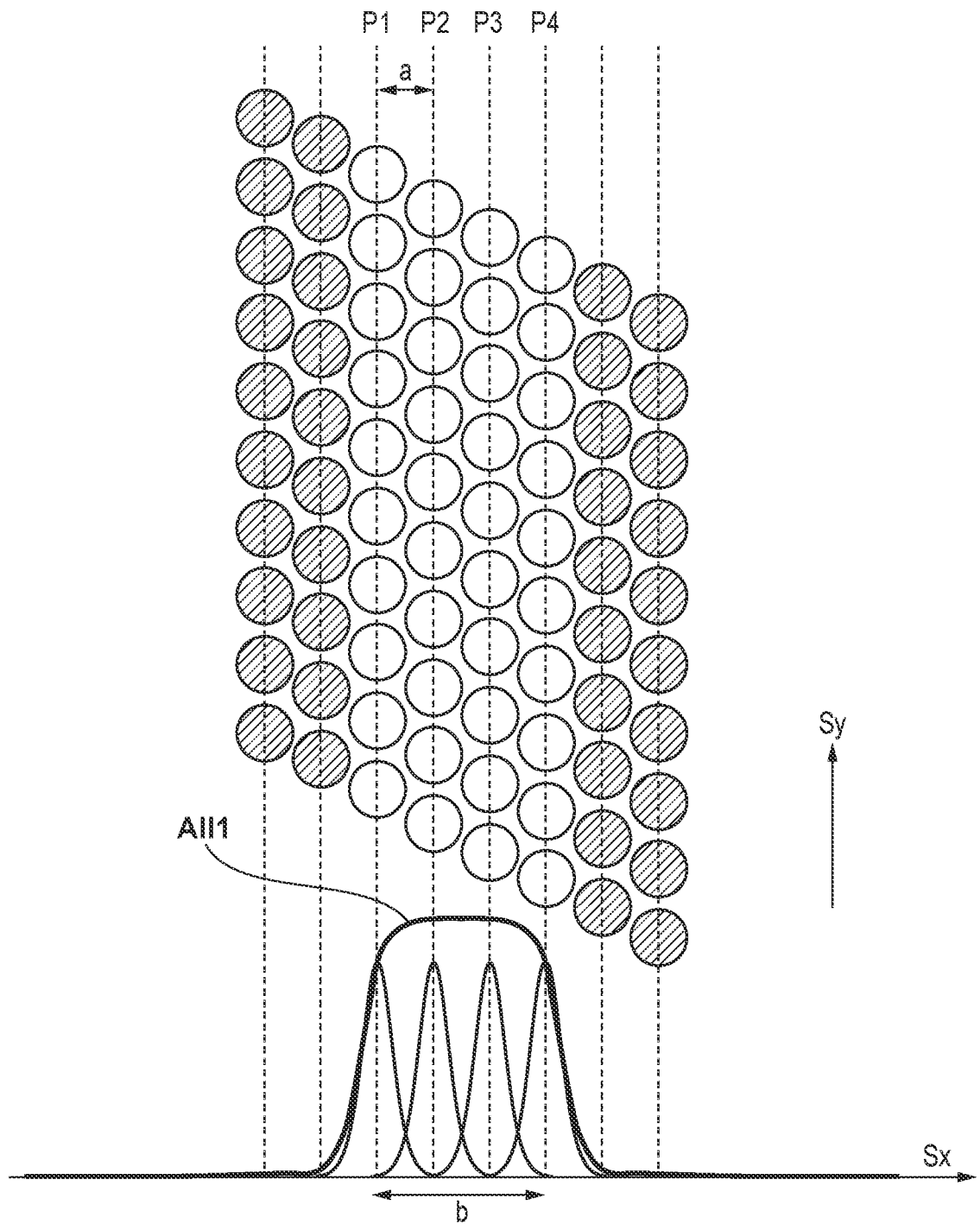
FIG. 5 is a view for explaining pattern formation by combining adjacent spots.

FIG. 5 is a view showing an example of a pattern exposure method. The diameter of a spot corresponding to each mirror of the DMD is a [μm], and the spots are arranged at intervals of a [μm] in the direction Sx. Black and white circles in FIG. 5 represent the spot positions of the respective mirrors of the DMD. The white circle represents a portion in which illumination light entering the DMD is reflected by a mirror in an ON state and enters the projection optical system PO 1, and the black circle represents a portion in which illumination light entering the DMD is reflected by a mirror in an OFF state and does not enter the projection optical system PO 1. The schematic view drawn on the lower side of FIG. 5 represents the optical image intensity (integrated exposure amount) by the spots.

In the exposure apparatus, the spots formed by the light reflected by the respective ON-state mirrors arranged in line in the scanning direction Sy among the plurality of mirrors of the DMD by scanning a substrate are superimposed at a plurality of positions aligned in the non-scanning direction Sx in a pattern. As a result, a pattern formed by a plurality of positions aligned in the non-scanning direction Sx is formed. In FIG. 5, at four positions (P1 to P4) aligned in the direction Sx, the total value of the amounts of the light components reflected by the ON-state mirrors aligned in line in the scanning direction Sy is calculated as an integrated exposure amount. Reference symbol AII1 represents the distribution (intensity distribution) of the integrated exposure amount at each of the four positions aligned in the direction Sx. In this way, the final pattern shape is formed by summing the light amounts in the direction Sy at each of the four spots arranged in the direction Sx. In the case of FIG. 5, a width b of the pattern shape is approximately b=4a. In this example, a pattern formation method in the case in which four spots in the direction Sx are summed has been described, but the spot forming portion to be used and the number of spots to be summed are determined according to the final pattern shape.

(Pattern Exposure Method)

Figure 6:
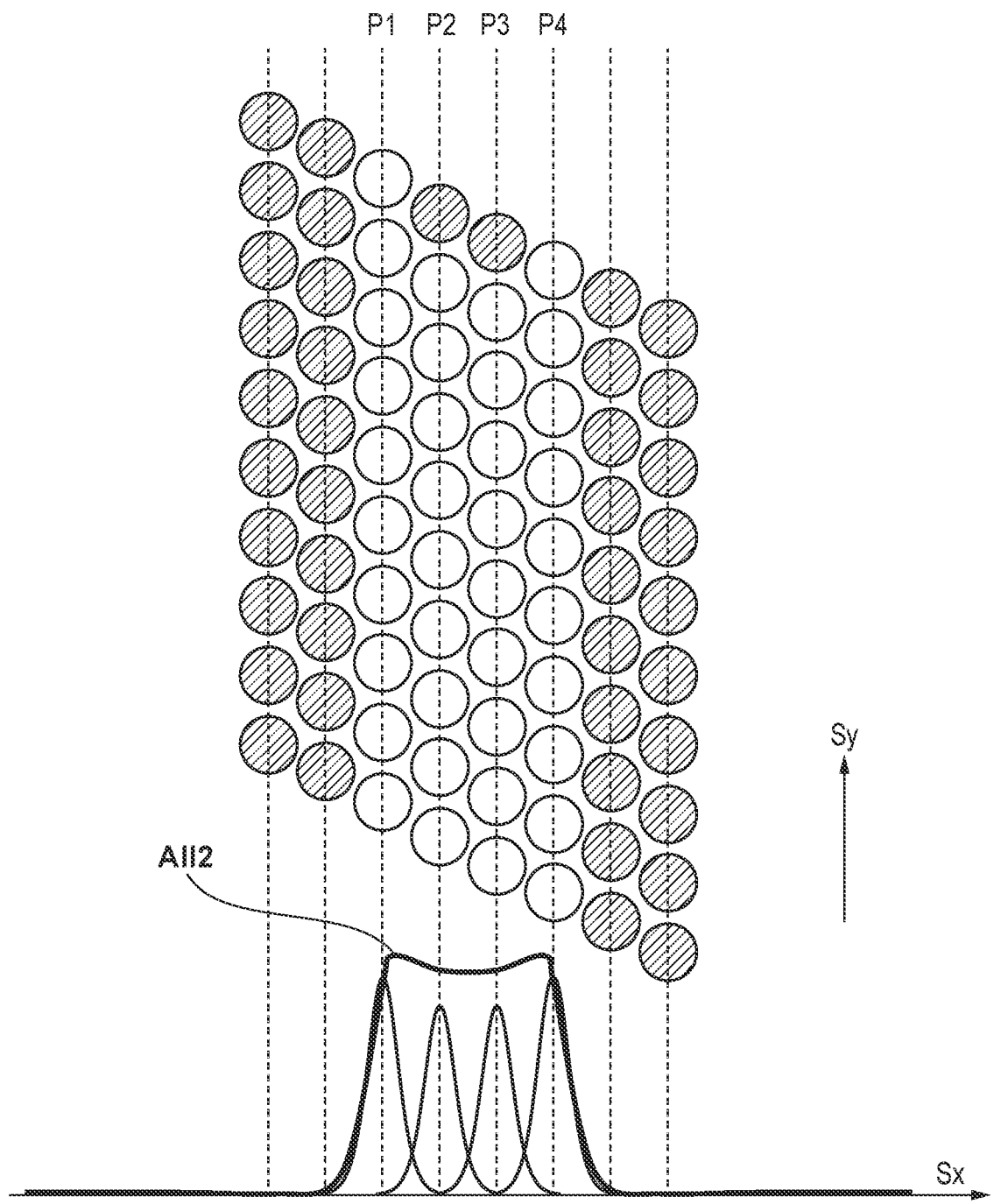
FIG. 6 is a view for explaining a pattern edge emphasizing method.

Next, with reference to FIGS. 5 and 6, a technique for substantially improving the contrast will be described. The pattern formation method is the same as the method described with reference to FIG. 5. However, as shown in FIG. 6, the exposure method for portions P2 and P3 other than the pattern edge portion is different.

In FIG. 5, in the spot formation schematically at P1 to P4, light energies for 10 points in the direction Sy are integrated to form a spot. In contrast to this, in FIG. 6, the light energies for 10 points are integrated in P1 and P4, and the light energies for 9 points are integrated in P2 and P3. Accordingly, in P2 and P3, the integrated light intensity decreases to $9/10$ and the optical image intensity is also an intensity of $9/10$. As a result, the intensity distribution in the four spots aligned in the direction Sx becomes as represented by AII2, and the intensity in the portion other than the edge portion of the pattern is relatively lower than that in the edge portion as compared with AII1 in FIG. 5.

This can emphasize the edge portion of the pattern so that the substantial contrast of the final pattern shape is emphasized. In this example, the integrated energy of the light in the portion other than the edge portion is reduced. However, in order to emphasize the pattern edge, the same effect can be obtained by increasing the integrated energy in the pattern edge portion.

(Method of Selecting DMD Mirrors to be Used)

As described above, it is understood that the profile of the optical image intensity distribution at the time of pattern formation can be changed by changing the light energy used for pattern formation between the edge portion and the portion other than the edge portion of the pattern in the final pattern shape. When it is desired to change the light energy more preferably, the following method may be adopted.

In a practical maskless exposure apparatus, the distribution of illumination light entering the DMD is not uniform. Even if the distribution is uniform, due to the influence of the reflectance difference among the mirrors of the DMD, the unevenness of the transmittance of the optical device surface from the DMD to the substrate, the unevenness of reflectance, and the like, the light intensities of the spots generated by the respective mirrors are uneven. Ignoring these effects, even if the light energy is changed to emphasize the edge portion of a pattern, it is difficult to obtain a sufficient effect.

Accordingly, the controller CTR measures in advance the light intensities of spots formed by the respective mirrors of the DMD. By doing this, the relative relation of the light intensities of the spots formed by the respective mirrors of the DMD can be known, which is usable for selecting the mirrors to be used for pattern formation.

Figure 7:
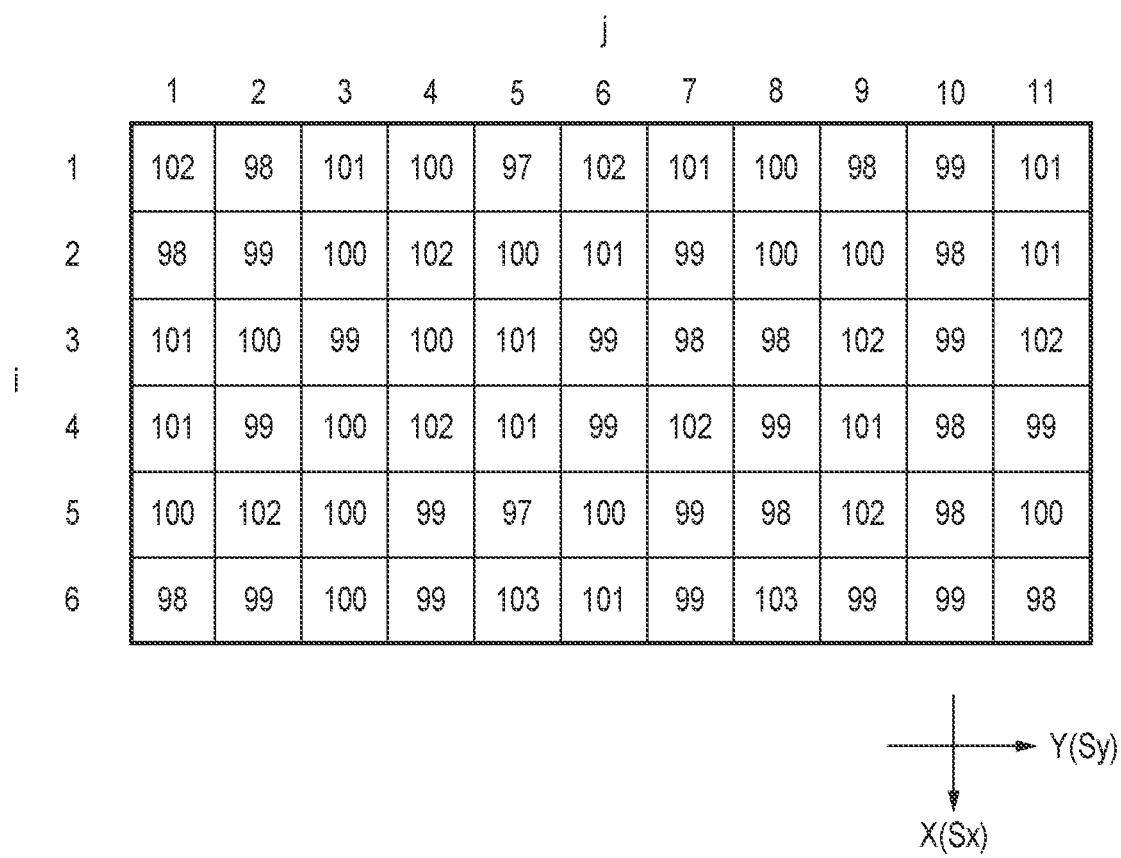
FIG. 7 is a view showing an example of a relative light intensity table of spots formed by respective mirrors of the DMD.

FIG. 7 is a table showing the relative light intensities of the spots formed by the respective mirrors of the DMD. In order to facilitate the explanation, the arrangement of the DMD is simplified, and the DMD is assumed to include six mirrors in the X direction (corresponding to the non-scanning direction Sx) and eleven mirrors in the Y direction (corresponding to the scanning direction Sy), thereby including sixty-six mirrors in total. In practice, the number of the mirrors of the DMD is further larger, and it is necessary to consider that the DMD is used while twisting the X-axis from the direction Sx.

Assuming that the position of each DMD mirror in the X direction is represented by i and that in the Y direction is represented by j, a relative intensity distribution I (i, j) obtained by measurement is a value close to 100 as shown in FIG. 7. The relative light intensity of each spot at the X (Sx) position is obtained by summing the light energies in the Y (Sy) direction for j=1 to 11 as described above. When the relative intensities are all summed at each of i=1 to 6, the following values can be obtained.

i=1:1099
i=2:1099
i=3:1100
i=4:1101
i=5:1095
i=6:1098

Assume that the final pattern shape is formed by four columns of i=2 to 5. In this case, by selecting the DMD mirrors to be used, for example, as shown in FIGS. 8A to 8C, the integrated energies (integrated exposure amounts) of light become uniform among i=2 to 5.

FIG. 8A is a table in which the relative spot intensities of the respective DMD mirrors are aligned, and the respective values are the same as those in FIG. 7. FIG. 8B is a table describing data representing ON/OFF of each mirror of the DMD, in which "1" represents that the DMD mirror is used for exposure (ON) and "0" represents that the DMD mirror is not used for exposure (OFF). FIG. 8C is a table showing the relative spot intensities by the respective mirrors of the DMD and their integration sums. In this example, nine out of eleven selectable DMD mirrors in the Y direction are selected to generate a uniform integrated energy (898). When there are more DMD mirrors in the X and Y directions, it is not necessary to equalize the numbers of mirrors to be used.

Next, with reference to FIGS. 9A to 9C, a method of emphasizing the edge portion of a pattern will be described. FIG. 9A is a table in which the relative spot intensities of the respective mirrors of the DMD are aligned, which is the same table as in FIG. 8A. FIG. 9B is a table similar to FIG. 8B and describing data representing ON/OFF of each mirror of the DMD, in which "1" represents that the mirror is used for exposure (ON), and "0" represents that the mirror is not used for exposure (OFF). Compared with FIG. 8B, the mirrors at (i, j)=(2, 8) and (5, 11) are changed to ON. FIG. 9C is a table similar to FIG. 8C and showing the relative spot intensities by the respective mirrors of the DMD and their integration sums. Since the mirrors at (i, j)=(2, 8) and (5, 11) are additively set to ON, the integrated energy in the edge portions (i=2 and 5) becomes 998 in FIG. 9C, which is higher than 898 in the portions (i=3 and 4) other than the edge portion. As a result, the optical image intensity (integrated exposure amount) in the edge portion of the pattern is increased, the pattern edge portion is emphasized, and the substantial contrast of the final pattern shape is emphasized.

The relation between a difference in integrated energy and the contrast emphasizing effect depends on a condition upon exposing a substrate, that is, the NA and exposure wavelength of a projection optical system, a coherent factor, the type of a photosensitive material applied onto the substrate, and the like. Therefore, there is a possibility that the relation differs for every exposure and trial and error may be required in some cases.

(Application Example to Two-Dimensional Pattern)

Figure 10A:
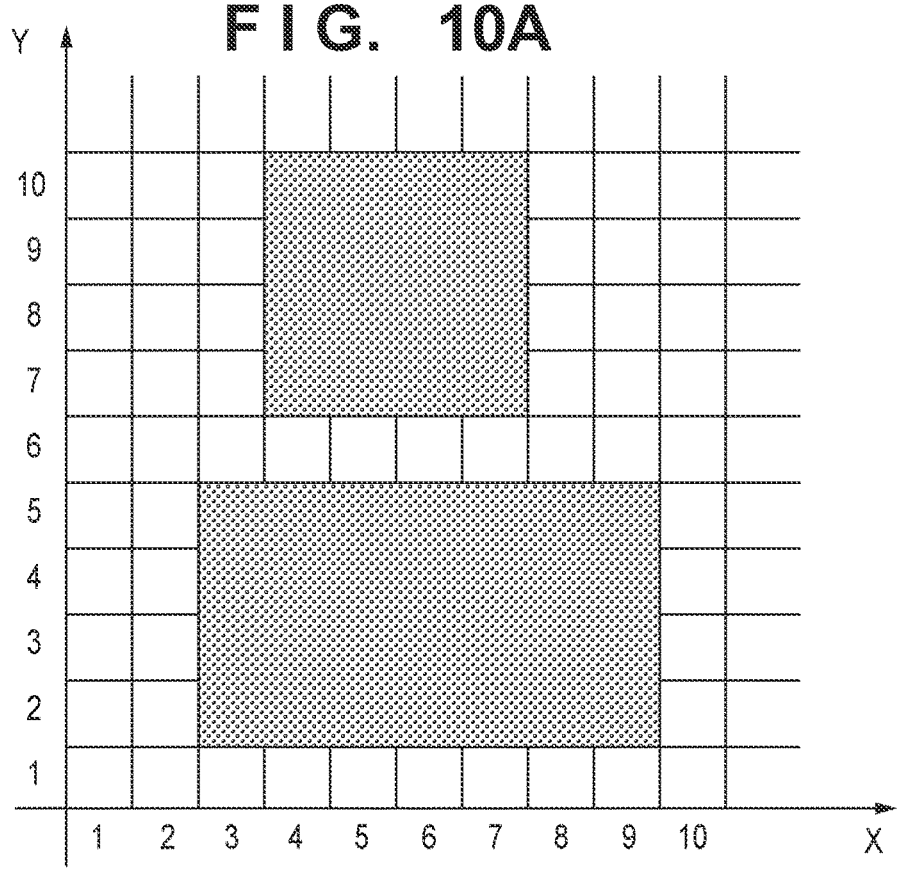
FIGS. 10A and 10B are views for explaining a pattern edge emphasizing method when two-dimensionally exposing a pattern.

An example in which a pattern is two-dimensionally exposed in the X and Y directions will be described next. FIG. 10A shows patterns to be exposed onto the XY plane on a substrate. Two patterns are shown in FIG. 10A, in which the upper pattern shape is formed by 4×4 segments and the lower pattern shape is formed by 4×7 segments. The width of one segment in the X direction (non-scanning direction) corresponds to the width of one DMD mirror.

The controller CTR classifies the segments of the two patterns into a pattern edge portion and a portion other than the pattern edge portion. In the X- and Y-coordinates shown in FIGS. 10A and 10B, the two patterns are described as follows.

<Group A> Coordinates (X, Y) of the pattern edge portion
(3, 2), (3, 3), (3, 4), (3, 5)
(4, 2), (4, 5), (4, 7), (4, 8), (4, 9), (4, 10)
(5, 2), (5, 5), (5, 7), (5, 10)
(6, 2), (6, 5), (6, 7), (6, 10)
(7, 2), (7, 5), (7, 7), (7, 8), (7, 9), (7, 10)
(8, 2), (8, 5)
(9, 2), (9, 3), (9, 4), (9, 5)
<Group B> Coordinates (X, Y) of the portion other than the pattern edge portion
(4, 3), (4, 4)
(5, 3), (5, 4), (5, 8), (5, 9)
(6, 3), (6, 4), (6, 8), (6, 9)
(7, 3), (7, 4)
(8, 3), (8, 4)

Figure 10B:
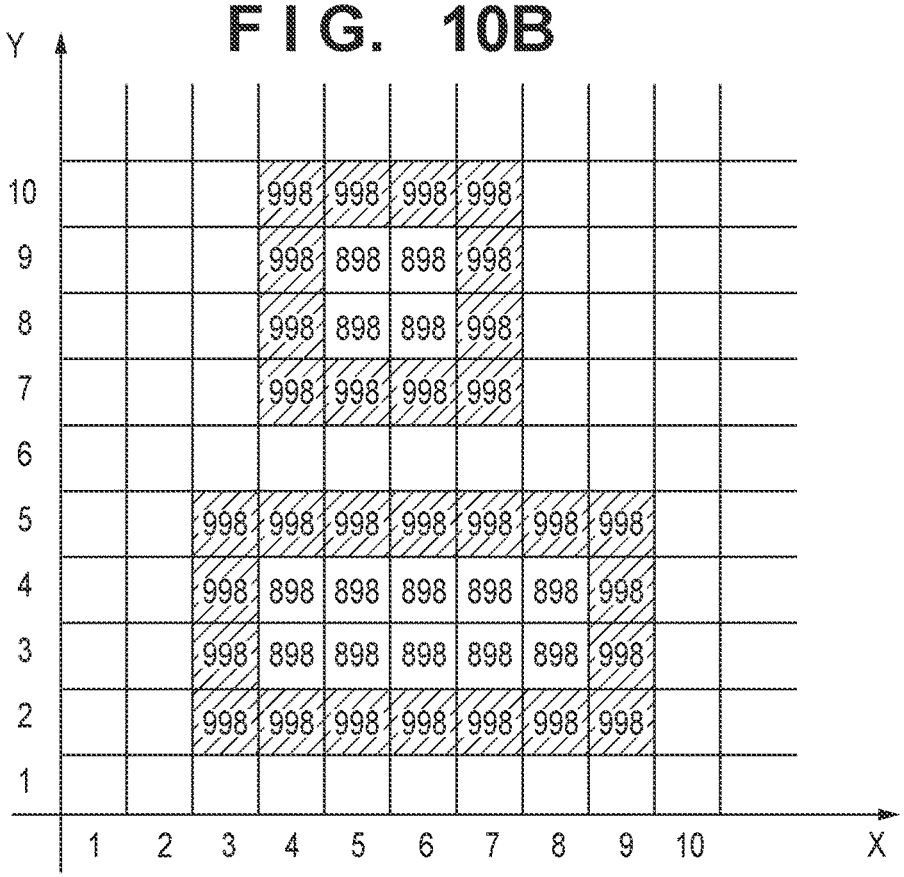

Next, the exposure amount of group A and that of group B are determined. In this example, for example, the exposure amount of group A is set to 998 and that of group B is set to 898. FIG. 10B shows the determined exposure amounts of the respective segments. After that, the positions of the DMD mirrors to be used are selected such that the respective exposure amounts are realized. The selection method is the same as described above.

In this way, the coordinates of the respective spots of the edge portion extending in the scanning direction of a pattern and those of the edge portion extending in the non-scanning direction are obtained in advance. Then, during scanning a substrate, the controller CTR controls ON/OFF of the plurality of mirrors such that the integrated exposure amount in each spot at the coordinates obtained in advance becomes larger than the integrated exposure amount in the other spot.

(Exposure Procedure)

Figure 11:
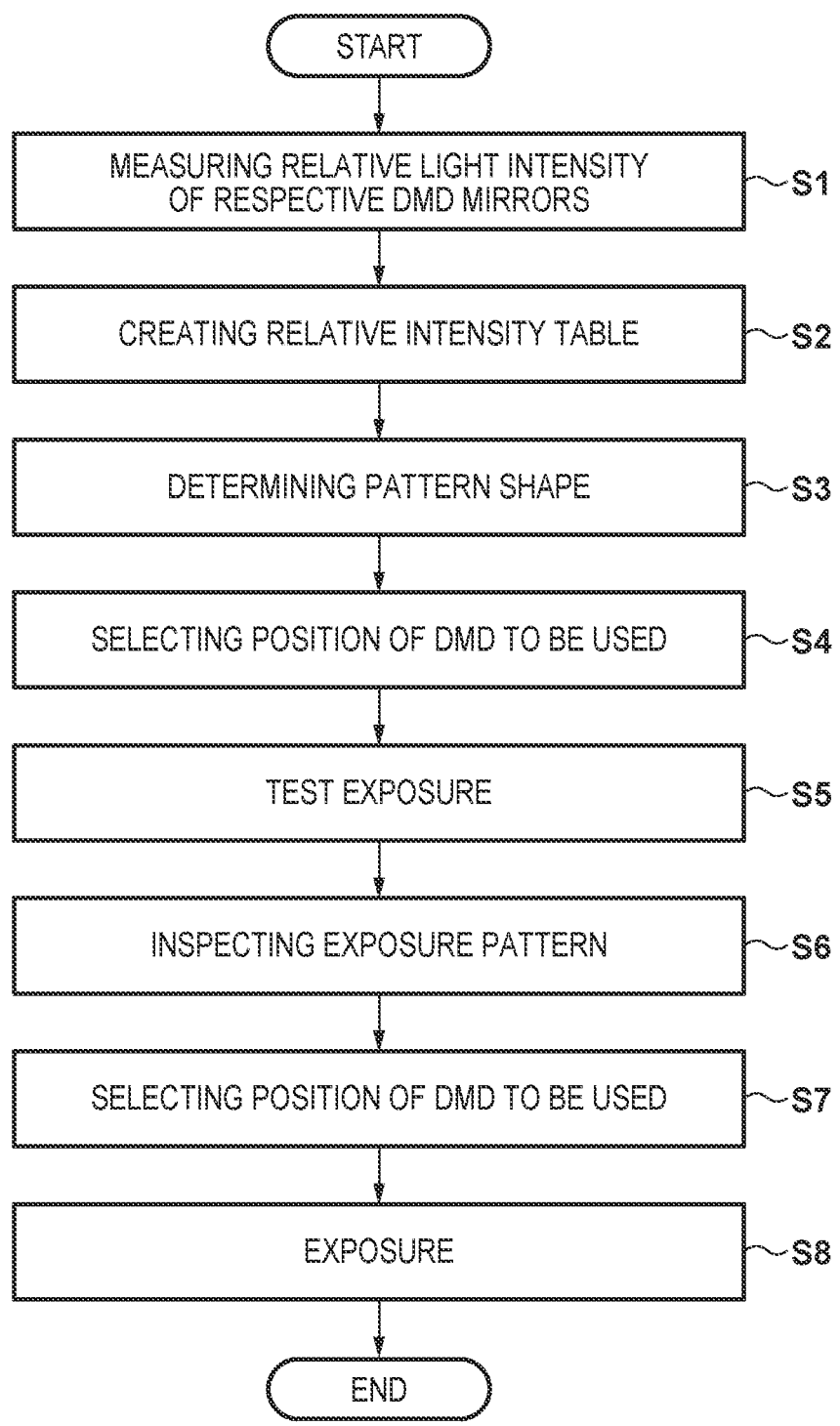
FIG. 11 is a flowchart for explaining an exposure process.

An exposure process in this embodiment will be described next with reference to a flowchart shown in FIG. 11. In S1, the controller CTR measures, in advance, the relative light intensities of spots formed by the mirrors of the DMD. In S2, the controller CTR generates a light intensity table, for example, as shown in FIG. 9A (FIG. 8A) based on the result of the light intensity measurement. The generated table is stored in, for example, the memory 11 of the controller CTR. Then, in S3, the controller CTR determines an exposure pattern shape, for example, as shown in FIG. 5. In S4, the controller CTR determines the positions of the DMD mirrors to be temporarily used for the pattern shape determined in S3, and generates a mirror selection table as shown in FIG. 8B. At this stage, the table is set such that the integrated exposure amount in the pattern becomes uniform. The generated mirror selection table is stored in, for example, the memory 11 of the controller CTR. In other words, in S4, ON/OFF of each mirror of the DMD is determined based on the result of the measurement in S1 such that the integrated exposure amount in the pattern becomes uniform.

After that, in accordance with the generated mirror selection table, first exposure (test exposure) is performed (S5), and the exposure result is examined using a microscope or the like. The controller CTR obtains the profile of the pattern obtained by this test (S6). At this time, if the profile of the desired pattern is obtained, the exposure condition is determined immediately. However, in general, the profile of the pattern is not often the desired shape. In that case, the controller CTR reselects the positions of the DMD mirrors to be used in S7. More specifically, the controller CTR rewrites the data in the mirror selection table stored in the memory 11, for example, as shown in FIG. 9B such that the edge of the pattern is emphasized. In other words, based on the result of the test exposure performed in accordance with the result of determination in S4, the controller CTR corrects the result of determination in S4 such that the integrated exposure amounts in the respective spots in the edge portion of the pattern become larger than those in the respective spots in the portion other than the edge portion. After that, in S8, the controller CTR performs exposure in accordance with the result corrected in S7.

In this way, by selecting twice the positions of the DMD mirrors to be used, it is possible to perform exposure with an appropriate pattern shape so that the defective rate of a substrate can be reduced. Note that when performing exposure under the same exposure condition, it is highly likely that the DMD mirror position selection result obtained in the past can be used so it is not necessary to perform test exposure every time.

<Embodiment of Article Manufacturing Method>

An article manufacturing method according to an embodiment of the present invention suitably manufactures an article, for example, a microdevice such as a semiconductor device or an element having a microstructure. The article manufacturing method of this embodiment includes a step of forming a latent pattern by using the above-described patterning method or lithography apparatus on a photosensitive agent applied on a substrate (a step of exposing the substrate), and a step of processing (developing) the substrate on which the latent pattern has been formed in the above step. In addition, the manufacturing method includes other well-known steps (for example, oxidation, film formation, deposition, doping, planarization, etching, resist removal, dicing, bonding, and packaging). The article manufacturing method of this embodiment is more advantageous than the conventional methods in at least one of the performance, quality, productivity, and production cost of the article.

Other Embodiments

Embodiment(s) of the present invention can also be realized by a computer of a system or apparatus that reads out and executes computer executable instructions (e.g., one or more programs) recorded on a storage medium (which may also be referred to more fully as 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-051519, filed Mar. 19, 2018, which is hereby incorporated by reference herein in its entirety.

What is claimed is:

1. An exposure apparatus that performs scanning exposure for a substrate, comprising:
    a digital mirror device including a plurality of mirrors capable of controlling a direction of light emitted from a light source and configured to operate to adjust an integrated exposure amount on the substrate in accordance with scanning of the substrate;
    a projection optical system configured to guide light from the digital mirror device to the substrate and project a pattern onto the substrate; and
    a controller configured to control the plurality of mirrors in the digital mirror device based on the pattern to be projected onto the substrate,
    wherein the controller is configured to control the plurality of mirrors such that an edge portion of the pattern is emphasized by making an integrated exposure amount in the edge portion larger than an integrated exposure amount in a portion other than the edge portion, and
    wherein the controller is configured to obtain, in advance, coordinates of respective spots in an edge portion extending in the scanning direction and an edge portion extending in the non-scanning direction of the pattern.

2. The apparatus according to claim 1, wherein the digital mirror device operates to adjust an integrated exposure amount on the substrate by controlling ON/OFF of each of the plurality of mirrors.

3. The apparatus according to claim 2, wherein the exposure apparatus is configured to form a pattern formed on a plurality of positions arranged in a non-scanning direction so that at the plurality of positions, spots formed by light reflected by the respective ON-state mirrors aligned in line in a scanning direction among the plurality of mirrors are superimposed by scanning the substrate, and
    the integrated exposure amount is calculated as a total value of amounts of the light reflected by the respective ON-state mirrors aligned in line in the scanning direction.

4. The apparatus according to claim 3, wherein the controller is configured to:
    during scanning of the substrate, control ON/OFF of the plurality of mirrors such that an integrated exposure amount in the spot at the coordinates obtained in advance becomes larger than an integrated exposure amount in other spots.

5. The apparatus according to claim 3, wherein
    the plurality of mirrors are aligned in a row direction and a column direction, and
    the row direction and the column direction are oblique with respect to the scanning direction.

6. The apparatus according to claim 1, wherein the controller is configured to measure, in advance, an integrated exposure amount of light reflected by each of the plurality of mirrors and guided to the substrate, and controls ON/OFF of the plurality of mirrors based on a result of the measurement.

7. An exposure method in an exposure apparatus that performs scanning exposure for a substrate,
    the exposure apparatus comprising a digital mirror device including a plurality of mirrors capable of controlling a direction of light emitted from a light source and configured to operate to adjust an integrated exposure amount on the substrate in accordance with scanning of the substrate, a projection optical system configured to guide light from the digital mirror device to the substrate and project a pattern onto the substrate, and a controller configured to control the plurality of mirrors in the digital mirror device based on the pattern to be projected onto the substrate,
    the method comprising:
    measuring, in advance, an integrated exposure amount of light reflected by each of the plurality of mirrors in the digital mirror device and guided to the substrate;
    determining ON/OFF of each of the plurality of mirrors in the digital mirror device based on a result of the measuring such that an integrated exposure amount in the pattern becomes uniform;
    obtaining, in advance, coordinates of respective spots in an edge portion extending in the scanning direction and an edge portion extending in the non-scanning direction of the pattern;
    correcting, based on a result of test exposure performed in accordance with a result of the determining, the result of the determining such that an edge portion of the pattern is emphasized by making an integrated exposure amount in the edge portion larger than an integrated exposure amount in a portion other than the edge portion; and
    exposing the substrate in accordance with the corrected result.

8. The method according to claim 7, wherein
    the determining includes generating a table describing data representing ON/OFF of each of the plurality of mirrors as a result of the determining, and storing the table in a storage unit, and
    the correcting includes rewriting the data in the table stored in the storage unit.

9. An article manufacturing method comprising:
    exposing a substrate using an exposure apparatus; and
    developing the substrate exposed in the exposing,
    wherein an article is manufactured from the developed substrate,
    wherein the exposure apparatus is configured to perform scanning exposure for the substrate,
    wherein the exposure apparatus comprises:
    a digital mirror device including a plurality of mirrors capable of controlling a direction of light emitted from a light source and configured to operate to adjust an integrated exposure amount on the substrate in accordance with scanning of the substrate;

a projection optical system configured to guide light from the digital mirror device to the substrate and project a pattern onto the substrate; and a controller configured to control the plurality of mirrors in the digital mirror device based on the pattern to be projected onto the substrate, wherein the controller is configured to control the plurality of mirrors such that an edge portion of the pattern is emphasized by making an integrated exposure amount in the edge portion larger than an integrated exposure amount in a portion other than the edge portion, and wherein the controller is configured to obtain, in advance, coordinates of respective spots in an edge portion extending in the scanning direction and an edge portion extending in the non-scanning direction of the pattern.

10. The apparatus according to claim 1, wherein the controller is configured to control the plurality of mirrors such that the edge portion is nonuniform with respect to a portion other than the edge portion.

11. The apparatus according to claim 1, wherein the controller is configured to classify the pattern into an edge portion and a non-edge portion, generate a mirror selection table in which ON/OFF of each of the plurality of mirrors is defined such that the edge portion is emphasized by making an integrated exposure amount in the edge portion larger than an integrated exposure amount in the non-edge portion, and control the plurality of mirrors in accordance with the generated mirror selection table while scanning the substrate.

* * * * *